(12) United States Patent
Cheng

(10) Patent No.: US 8,251,712 B2
(45) Date of Patent: Aug. 28, 2012

(54) PRINTED CIRCUIT BOARD MODULE

(75) Inventor: Chien-Pang Cheng, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 15 days.

(21) Appl. No.: 12/979,369

(22) Filed: Dec. 28, 2010

(65) Prior Publication Data

US 2011/0269319 A1    Nov. 3, 2011

(30) Foreign Application Priority Data

Apr. 28, 2010  (CN) .......................... 2010 1 0157510

(51) Int. Cl.
*H01R 12/00*     (2006.01)

(52) U.S. Cl. .......................................... 439/67; 439/329

(58) Field of Classification Search ................ 439/66, 439/67, 91, 329, 493
See application file for complete search history.

(56) References Cited

U.S. PATENT DOCUMENTS

| | | | | |
|---|---|---|---|---|
| 3,960,424 A * | 6/1976 | Weisenburger | ................ | 439/66 |
| 4,057,311 A * | 11/1977 | Evans | ....................... | 439/66 |
| 6,123,551 A * | 9/2000 | Westfall | .......................... | 439/67 |
| 6,403,226 B1 * | 6/2002 | Biernath et al. | .............. | 428/447 |
| 6,520,789 B2 * | 2/2003 | Daugherty et al. | ........... | 439/329 |
| 6,869,291 B2 * | 3/2005 | Norland et al. | .................. | 439/67 |
| 7,435,101 B2 * | 10/2008 | Yoneta et al. | ................... | 439/67 |
| 2001/0041465 A1 * | 11/2001 | Szalay et al. | .................... | 439/67 |
| 2002/0151196 A1 * | 10/2002 | Tai et al. | ......................... | 439/67 |

* cited by examiner

*Primary Examiner* — Thanh Tam Le

(74) *Attorney, Agent, or Firm* — Altis Law Group, Inc.

(57) ABSTRACT

A PCB module includes a first rigid PCB having a first edge connector, a second rigid PCB having a second edge connector, and a connecting mechanism. The connecting mechanism includes a flexible connecting board, an elastic member, and a fixing member. The flexible connecting has a number of connecting circuit traces isolated from each other. The flexible connecting board is bent in such a manner that a first end portion is in contact with the first edge connector, and a second end portion is in contact with the second edge connector. Thus, the first edge connector is electrically connected with the second edge connector by the traces. The elastic member is compressed between the end portions of the flexible connecting board. The fixing member is configured to fix the first rigid PCB to the second rigid PCB and compress the elastic member.

19 Claims, 5 Drawing Sheets

PRINTED CIRCUIT BOARD MODULE

BACKGROUND

1. Technical Field

The present disclosure generally relates to printed circuit boards (PCBs), and particularly, to a PCB module including two rigid PCBs.

2. Description of Related Art

PCBs are widely used in various electronic devices such as mobile phones, printers, and hard disk drives for having electronic components mounted thereon and providing electrical transmission. With the development of electronic technology, PCBs can now be bonded together to form PCB modules to have increased capacity. Connectors having contacts are used to electrically connect the PCBs. However, a welding process is needed to mechanically connect the connector to the PCBs. However, the high temperatures of welding may damage the PCBs.

What is needed, therefore, is a PCB module that overcomes the aforementioned problem.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments will now be described in detail below and with reference to the drawings.

Referring to FIGS. 1 to 5, a printed circuit board (PCB) module 10 includes a first rigid PCB 11, a second rigid PCB 12, and a connecting mechanism 13.

Figure 1:
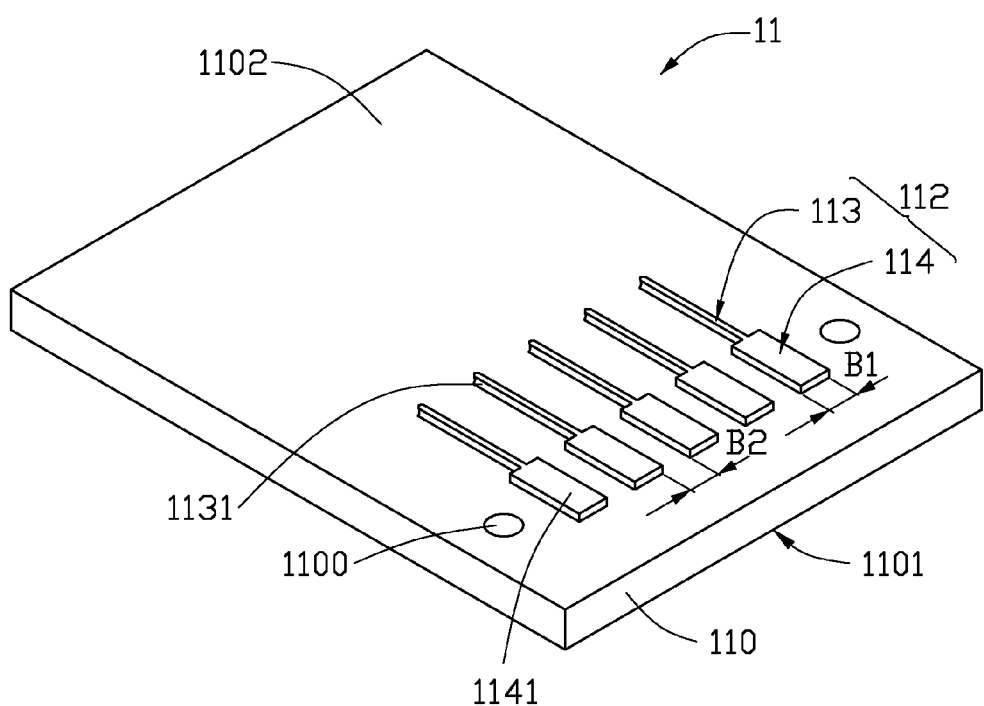
FIG. 1 is an isometric view of a first rigid PCB in accordance with an exemplary embodiment.

Referring to FIG. 1, the first rigid PCB 11 has a rectangular cross-section, and includes a first base layer 110 and a first electrically conductive layer 112. The first base layer 110 can consist of an insulating layer, and can also include at least one insulating layer and at least one copper layer. In other words, the first PCB 11 can be a single-sided PCB, a double-sided PCB, or a multilayer PCB. In the illustrated embodiment, the first PCB 11 is a single-sided PCB, and the first base layer 110 consists of rigid insulating material. The rigid insulating material can be one of phenolic resin, epoxy resin, and ceramic. The base layer 110 has a first surface 1101 and a second surface 1102 at an opposite side thereof to the first surface 1101. The material of the first conductive layer 112 is copper. The first conductive layer 112 is formed on the second surface 1102 of the first base layer 110, and includes a first pattern of traces 113 and a first edge connector 114. The first traces 113 include a number of first transmission circuits 1131. It is understood that the first traces 113 may also include other circuits, pads, and contacts, which are not shown on the FIG. 1.

The first edge connector 114 is adjacent to a side of the first PCB 11, and includes a number of first connecting contacts 1141 arranged parallel with each other along the side of the first PCB 11. Each of the first connecting contacts 1141 is connected with at least one first circuit 1131. In the illustrated embodiment, the first connecting contacts 1141 each have a rectangular cross-section and are connected with one first circuit 1131. The width of each of the first contacts 1141 (B1) is equal to the distance between each two adjacent first contacts 1141 (B2).

The first PCB 11 has two first through holes 1100 defined therein. The two first through holes 1100 are positioned at two opposite sides of the first edge connector 114.

Figure 2:
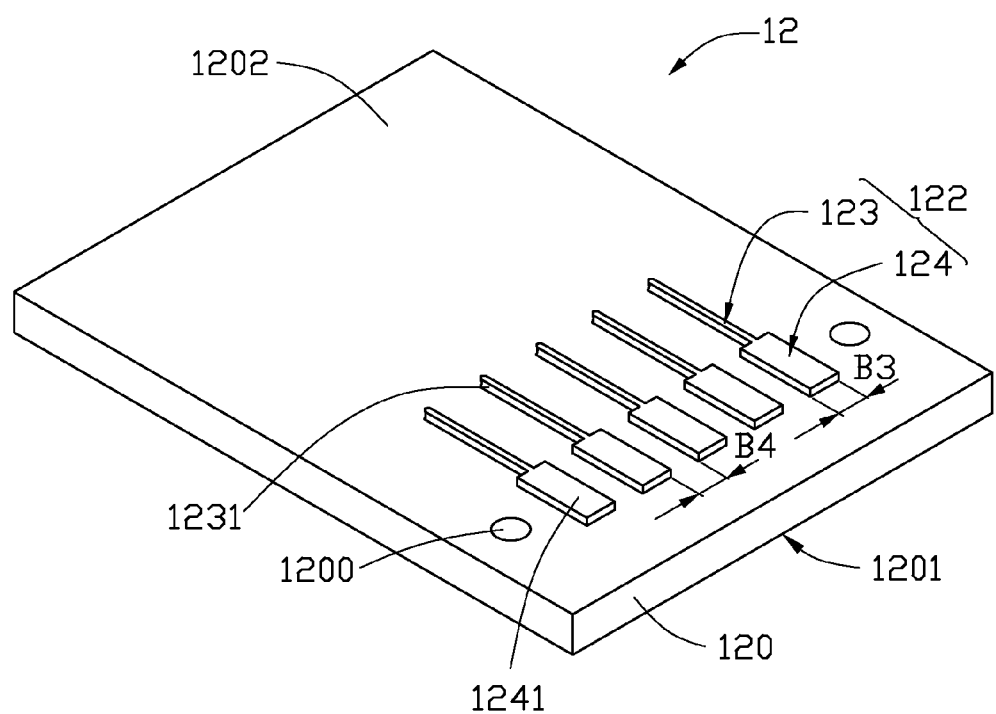
FIG. 2 is an isometric view of a second rigid PCB in accordance with an exemplary embodiment.
Figure 4:
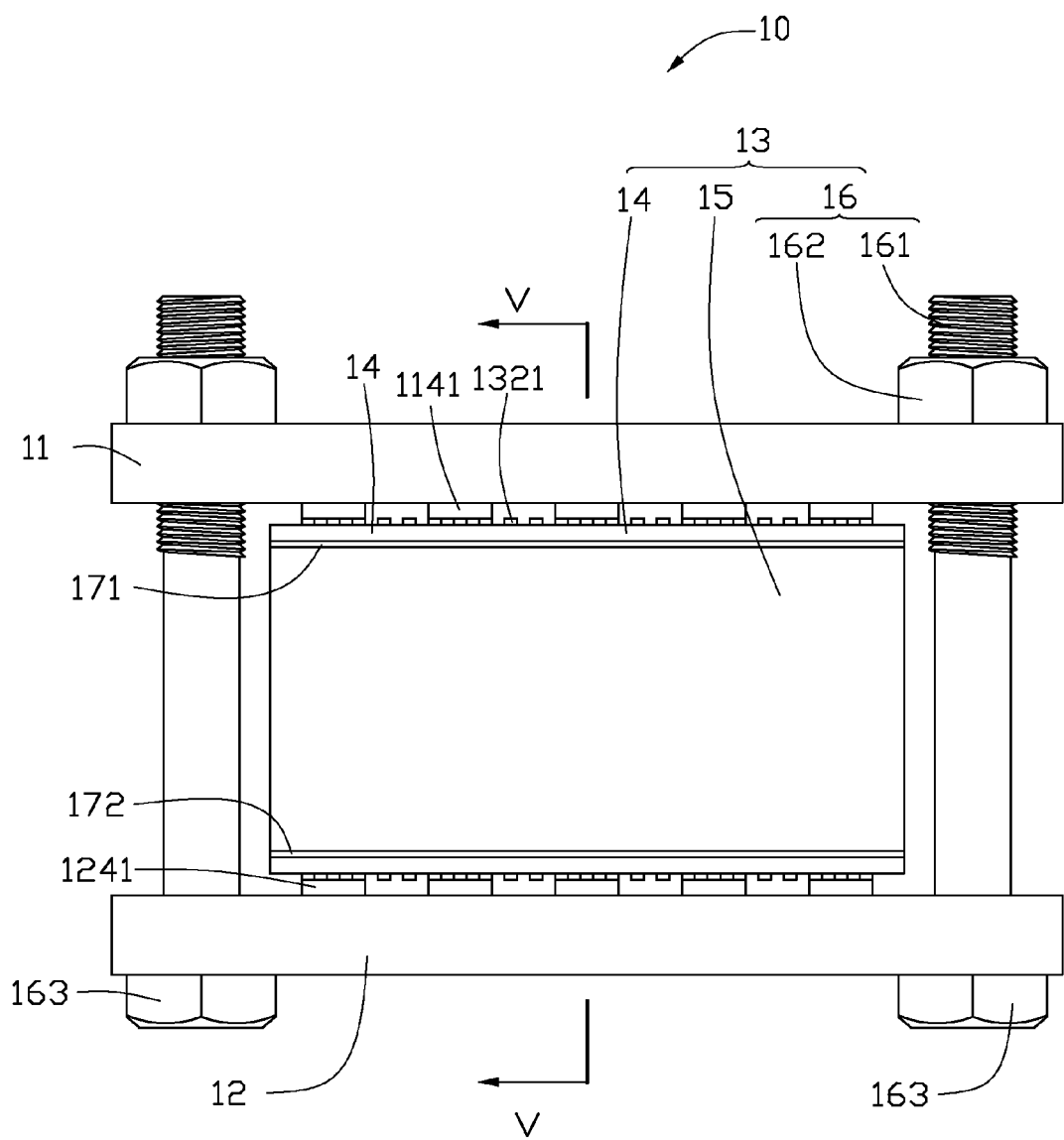
FIG. 4 is a left view of a PCB module including the first rigid PCB of FIG. 1, the second rigid PCB of FIG. 2, and the flexible connecting board of FIG. 3.
Figure 5:
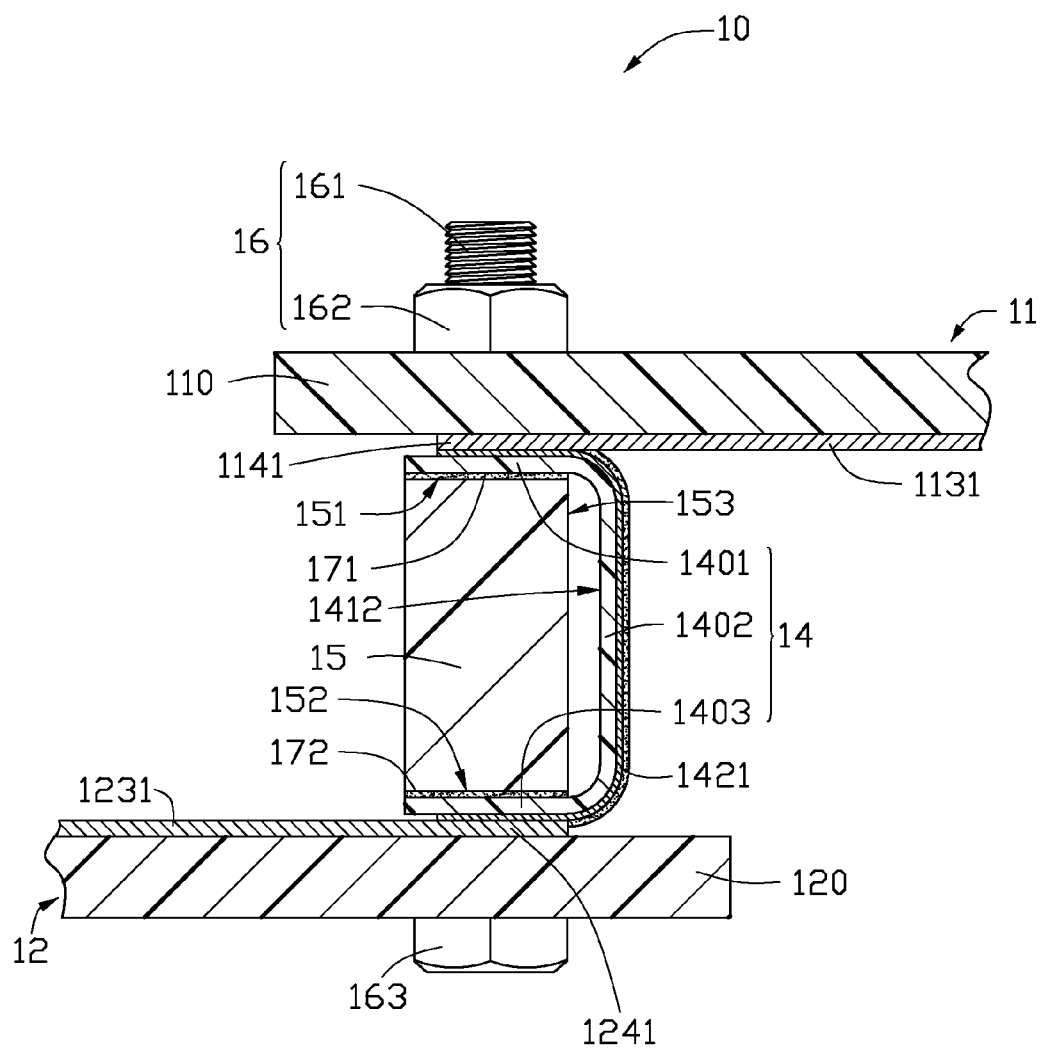
FIG. 5 is a sectional view of the PCB module of FIG. 4, taken along line V-V thereof.

Referring to FIGS. 2, 4, and 5, the second PCB 12 is substantially parallel to the first PCB 11. The second PCB 12 includes a second base layer 120 and a second electrically conductive layer 122. The second base layer 120 may consist of an insulating layer, and can also include at least one insulating layer and at least one copper layer. In other words, the second PCB 12 can be a single-sided PCB, a double-sided PCB, or a multilayer PCB. In the illustrated embodiment, the second PCB 12 is a single-sided PCB, and the second base layer 110 consists of rigid insulating material. The second base layer 120 has a third surface 1201 and a fourth surface 1202 at an opposite side thereof to the third surface 1201. The second conductive layer 122 is formed on the third surface 1201 and opposite to the first conductive layer 112. The second conductive layer 122 consists of copper, and includes a second pattern of traces 123 and a second edge connector 124. The second traces 123 include a number of second transmission circuits 1231. It is understood that the second traces 123 also include other circuits, pads, and contacts, which are not shown on the FIG. 2.

The second edge connector 124 is positioned adjacent to a side of the second PCB 12, and is configured for electrically connecting to the first edge connector 114 of the first PCB 11. The second edge connector 124 includes a number of second connecting contacts 1241 respectively corresponding to the first connecting contacts 1141. The second contacts 1241 are arranged parallel with each other, and each are connected with at least one second circuit 1231. In the illustrated embodiment, each of the second contacts 1241 has a rectangular cross-section, and is connected with one second circuit 1231. The width of each of the second contacts 1241 (B3) is equal to the distance between each two adjacent second contacts 1241 (B4). In the illustrated embodiment, B3 is equal to B1.

The second PCB 12 defines two second through holes 1200 corresponding to the first through holes 1100, respectively. The two second through holes 1200 are positioned at two opposite sides of the second edge connector 124.

The connecting mechanism 13 is configured for fixing and electrically connecting the first and the second PCBs 11 and 12. The connecting mechanism 13 includes a flexible connecting board 14, an elastic member 15, and a fixing member 16.

Figure 3:
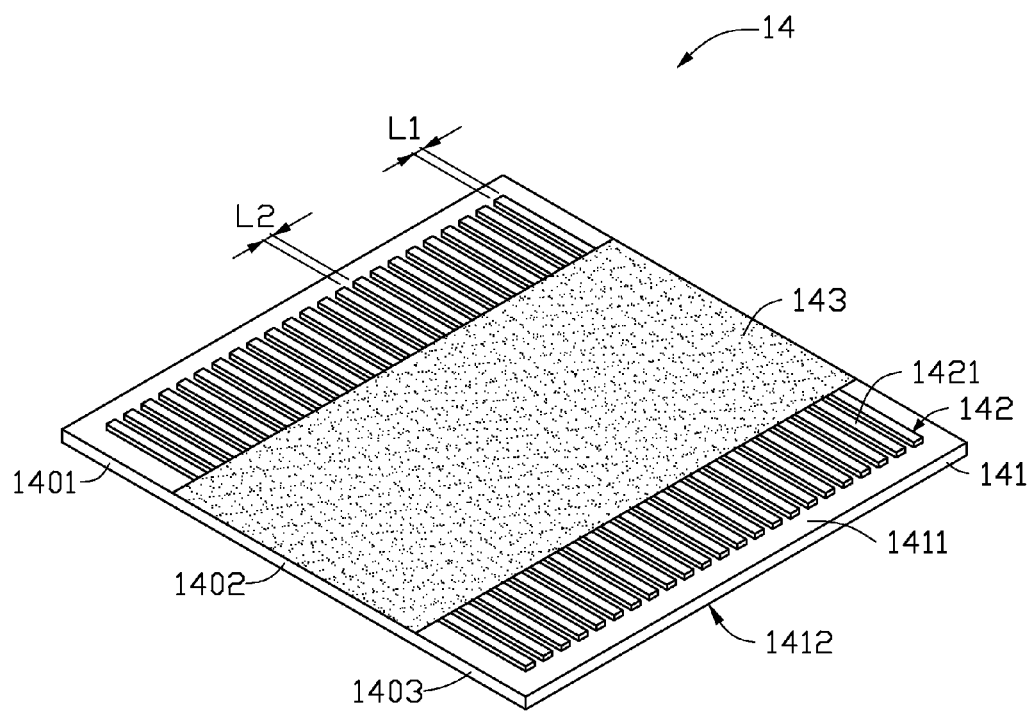
FIG. 3 is an isometric view of a flexible connecting board in accordance with an exemplary embodiment.

The flexible connecting board 14 is configured to electrically connect the first PCB 11 to the second PCB 12. Referring to FIG. 3, the flexible board 14 includes a third base layer 141, a third electrically conductive layer 142, and a coverlay 143. The third base layer 141 consists of flexible material, for instance, polyimide, polyethylene terephthalate, or polyethylene naphthalate. The third base layer 141 has a fifth surface 1411 and a sixth surface 1412 at an opposite side thereof to the fifth surface 1411. The third conductive layer 142 is formed on the fifth surface 1411, and includes a number of connecting circuit traces 1421 isolated from each other. In the illustrated embodiment, the traces 1421 are parallel with each other. The line width of the trace 1421 (L1) is equal to the line space between two adjacent traces 1421 (L2). L1, B1, and B3 are related with the following equations: $(1/6)B1 \leq L1 \leq (1/3)B1$, $(1/6)B3 \leq L1 \leq (1/3)B3$. In the present embodiment, $L1=L2=(1/5)B1$.

The traces 1421 extend along a lengthwise direction of the flexible connecting board 14. Along the extending direction of the traces 1421, the flexible board 14 includes a first connecting portion 1401, a bent portion 1402, and a second connecting portion 1403 connected in sequence. In other words, the bent portion 1402 interconnects the first and the second connecting portions 1401 and 1403. The coverlay 143 is covered on the bent portion 1402, covering the surface of the traces 1421 and the fifth surface 1411 exposed from the traces 1421. The coverlay 143 can be ink, PET, or other flexible material, and is used to protect the traces 1421 of the bent portion 1402.

The flexible board 14 is flexible enough to be bent into any shape. Referring to FIGS. 4 and 5, the flexible board 14 is bent into a U-shape and positioned between the first PCB 11 and the second PCB 12. When the board 14 is in the bent state, the first and the second connecting portions 1401 and 1403 are substantially parallel, and the bent portion 1402 is generally perpendicular to the first and the second connecting portions 1401 and 1403. Particularly, the first connecting portion 1401 is in contact with the first edge connector 114 of the first PCB 11, and the second connecting portion 1402 is in contact with the second edge connector 124 of the second PCB 12. In the first connecting portion 1401, a portion of the traces 1421 are in contact with and electrically connected to the first contacts 1141, and the remaining traces 1421 are positioned between the first contacts 1141. In the second connecting portion 1403, a portion of the traces 1421 is in contact with and electrically connected to the second contacts 1241, and the remaining traces 1421 are positioned between the second contacts 1241. Therefore, each of the first contacts 1141 is electrical connected to a corresponding second contact 1241 via at least one trace 1421. In the illustrated embodiment, each of the first contacts 1141 is electrically connected to a corresponding second contact 1241 by three traces 1421.

Referring to FIG. 4 and FIG. 5, the elastic member 15 is arranged between the first and the second connecting portions 1401 and 1403, and positioned between the first PCB 11 and the second PCB 12. The elastic member 15 is configured for supporting the flexible connecting board 14 in a bent state. The elastic member 15 can be a rubber block, or it can be some other elastic component such as a mechanical spring. In the illustrated embodiment, the elastic member 15 is a rectangular rubber block, which has a top surface 151, a bottom surface 152, and a side surface 153 interconnecting the top and the bottom surfaces 151 and 152. The first connecting portion 1401 is adhered on the top surface 151 by a first adhesive layer 171, the second connecting portion 1403 is adhered on the bottom surface 152 by a second adhesive layer 172, and the bent portion 1402 is positioned substantially spatially opposite to the side surface 153. In detail, the first adhesive layer 171 is positioned between and in contact with the top surface 151 and the sixth surface 1412 of the first connecting portion 1401. The second adhesive layer 172 is positioned between and in contact with the bottom surface 152 and the sixth surface 1412 of the second connecting portion 1403. In another embodiment, the bent portion 1402 can be adhered to the side surface 153.

The fixing member 16 is mounted on the first and the second PCBs 11 and 12. The fixing member 16 is configured to fix the first PCB 11 to the second PCB 12, and press the first and the second PCBs 11 and 12 together thus compressing the elastic member 15. The fixing member 16 can be a jig, or some other kind of clamping fixture mounted to the first PCB 11 and the second PCB 12. In the illustrated embodiment, the fixing member 16 includes two bolts 161 and two corresponding nuts 162. One end of each of the bolts 161 has a head 163, the other end of each of the bolts 161 has screw threads formed thereon. The bolts 161 pass through the first through holes 1100 and the second through holes 1200, respectively, and the nuts 162 are screwed onto bolts 161, respectively. The heads 163 are in contact with the second base layer 120 of the second PCB 12, and the nuts 162 are in contact with the first base layer 110 of the first PCB 11. In such cases, the distance between the first PCB 11 and the second PCB 12 can be changed by adjusting the position of the nuts 162 relative to the heads 163. The shorter the distance between the first PCB 11 and the second PCB 12, then the more compressed the elastic member 15. When the elastic member 15 is compressed, elastic restoring force is generated in the elastic member 15. The elastic restoring force pushes the first connecting portion 1401 attached on the top surface 151 nearer to the first PCB 11, and pushes the second connecting portion 1403 attached on the bottom surface 152 nearer to the second PCB 12. Therefore, the first connecting portion 1401 is in intimate contact with the first PCB 11, and the second connecting portion 1403 is in intimate contact with the second PCB 12. In other words, the electrical connection between the first edge connector 114 and the connecting circuit traces 1421 is reliable, and the electrical connection between the second edge connector 124 and the connecting circuit traces 1421 is reliable. That is, the electrical connection between the first and the second PCBs 11 and 12 is reliable.

It is understood that the number of the nuts and bolts 162,161 is not limited, and can be one or more than two, and a corresponding number of first and second through holes 1100,1200 are defined.

In PCB module 10 of the illustrated embodiment, the flexible connecting board 14 is bent in such a manner that the first connecting portion 1401 is in contact with the first edge connector 114 of the first PCB 11, and the second connecting portion 1403 is in contact with the second edge connector 124 of the second PCB 12. The fixing member 16 fixes the first and the second PCBs 11 and 12 together and compresses the elastic member 15e. Therefore, the elastic restoring force in the elastic member 15 biases the first edge connector 114 in tight contact with the connecting circuit traces 1421 of the first connecting portion 1401 and biases the second edge connector 124 in tight contact with the connecting circuit traces 1421 of the second connecting portion 1403. In all, electrical connections between the first PCB 11 and the second PCB 12 are ensured to be reliable and have a simple assembly structure.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. A printed circuit board (PCB) module, comprising:
   a first rigid PCB comprising a plurality of first connecting contacts;
   a second rigid PCB comprising a plurality of second connecting contacts, the second connecting contacts spatially corresponding to the first connecting contacts; and
   a connecting mechanism comprising:
   a flexible connecting board positioned between the first and the second rigid PCBs, the flexible connecting board comprising a plurality of connecting circuit traces isolated from each other, the flexible connecting board comprising a first connecting portion, a bent portion, a second connecting portion, and a coverlay covering the connecting circuit traces at the bent portion, the flexible connecting board being bent in such a manner that the first connecting portion is in contact with the first connecting contacts, the second connecting portion is in contact with the second connecting contacts, and each of the first connecting contacts is electrically connected to a corresponding second connecting contact via the corresponding connecting circuit trace;
   an elastic member compressed between the first and the second connecting portions; and
   a fixing member configured to fix the first and the second rigid PCBs together and compress the elastic member.

2. The PCB module of claim 1, wherein the first connecting contacts are arranged parallel with each other, the second connecting contacts are parallel with each other, and the connecting circuit traces are parallel with each other.

3. The PCB module of claim 2, wherein the width of each of the first connecting contacts is equal to the distance between each two adjacent first connecting contacts, the width of each of the second connecting contacts is equal to the distance between each two adjacent second connecting contacts, the width of each of the connecting circuit traces is equal to the distance between each two adjacent connecting circuit traces.

4. The PCB module of claim 3, wherein assuming B1 denotes the width of each of the first connecting contacts, B3 denotes the width of each of the second connecting contacts, the line width of each of the connecting circuit traces is in the range from about ($\frac{1}{6}$)B1 to about ($\frac{1}{3}$)B1, and is in the range from about ($\frac{1}{6}$)B3 to about ($\frac{1}{3}$)B3.

5. The PCB module of claim 3, wherein assuming B1 denotes the width of each of the first connecting contacts, B3 denotes the width of each of the second connecting contacts, the line width of each of the connecting circuit traces is in the range from ($\frac{1}{5}$)B1 to about ($\frac{3}{5}$)B1.

6. The PCB module of claim 1, wherein the first rigid PCB is parallel to the second rigid PCB, and the first connecting portion is parallel to the second connecting portion.

7. The PCB module of claim 1, wherein the elastic member includes a top surface, a bottom surface, and a side surface interconnecting the top and the bottom surfaces, the first connecting portion is adhered to the top surface, the second connecting portion is adhered to the bottom surface, and the bent portion is substantially opposite to the side surface.

8. The PCB module of claim 7, wherein the elastic member is a rubber block.

9. The PCB module of claim 7, wherein the elastic member is a mechanical spring.

10. The PCB module of claim 1, wherein the fixing member includes at least one fixing element, the first rigid PCB defines at least one corresponding first through hole, the second rigid PCB defines at least one corresponding second through hole, and the at least one fixing element passes through the at least one first and second through holes.

11. The PCB module of claim 1, wherein the first rigid PCB defines two through holes at two opposite sides of the first connecting contacts, the second rigid PCB defines two through holes at two opposite sides of the second connecting contacts, and the fixing member includes two bolts and two corresponding nuts, an end of each of the bolts has a head, the other end of each of the bolts has screw threads formed thereon, the bolts pass through the first through holes and the second through holes, the nuts are screwed onto the ends of the bolts having screw threads, the heads are in contact with the second rigid PCB, and the nuts are in contact with the first rigid PCB.

12. The PCB module of claim 1, wherein the first rigid PCB further comprises a first base layer, the first connecting contacts are formed on first base, the second rigid PCB further comprises a second base layer, the second connecting contacts are formed on the second base layer, and both of the first and the second base layers comprise at least one insulating layer and at least one copper layer.

13. A printed circuit board module, comprising:
    a first rigid PCB comprising a first edge connector;
    a second rigid PCB comprising a second edge connector;
    a connecting board positioned between the first and the second rigid PCBs, the connecting board comprising a flexible base layer and a plurality of connecting circuit traces formed on the flexible base layer, the flexible base layer comprising a first end portion, a second end portion opposite to the first end portion, a bent portion interconnecting the first and the second end portion, and a coverlay, the connecting circuit traces extending from the first end portion to the second end portion and being isolated from each other, the connecting board being bent in such a manner that the connecting circuits of the first end portion is in contact with the first edge connector, and the connecting circuits of the second end portion is in contact with the second edge connector, the coverlay covering the connecting circuit traces at the bent portion;
    an elastic member compressed between the first and the second end portions; and
    a fixing member fixing the first and the second rigid PCBs to the elastic member.

14. The PCB module of claim 13, wherein the first edge connector comprises a plurality of first connecting contacts arranged parallel with each other, the second edge connector comprising a plurality of second connecting contacts parallel with each other, and the connecting circuits are parallel with each other.

15. The PCB module of claim 14, wherein the width of each of the first connecting contacts is equal to the distance between each two adjacent first connecting contacts, the width of each of the second connecting contacts is equal to the distance between each two adjacent second connecting contacts, the width of each of the connecting circuits is equal to the distance between each two adjacent connecting circuit traces, assuming B1 denotes the width of each of the first connecting contacts, B3 denotes the width of each of the second connecting contacts, the line width of each of the connecting circuits is in the range from about ($\frac{1}{6}$)B1 to about ($\frac{1}{3}$)B1, and is in the range from about ($\frac{1}{6}$)B3 to about ($\frac{1}{3}$)B3.

16. The PCB module of claim 13, wherein the flexible base layer further comprises a bent portion interconnecting the first and the second end portions, the elastic member includes a top surface, a bottom surface, and a side surface substantially perpendicular to and between the top and the bottom surfaces, the first end portion is attached to the top surface, the second end portion is attached to the bottom surface, and the bent portion is attached to the side surface.

17. The PCB module of claim 16, wherein the elastic member is a rubber block.

18. The PCB module of claim 16, wherein the elastic member is a mechanical spring.

19. The PCB module of claim 13, wherein the fixing member includes at least one fixing element, the first rigid PCB defines at least one corresponding first through hole, the second rigid PCB defines at least one corresponding second through hole, and the at least one fixing element passes through the at least one first and second through holes.

* * * * *